US007215219B2

(12) United States Patent
Roldan et al.

(10) Patent No.: US 7,215,219 B2
(45) Date of Patent: May 8, 2007

(54) TEMPERATURE AND FREQUENCY VARIABLE GAIN ATTENUATOR

(75) Inventors: Nelson Roldan, Boca Raton, FL (US); Robert J. Blacka, Pennsauken, NJ (US); Alen Fejzuli, Palm City, FL (US)

(73) Assignee: Smith Interconnect Microwave Components, Inc., Stuart, FL (US)

( * ) Notice: Subject to any disclaimer, the term of this patent is extended or adjusted under 35 U.S.C. 154(b) by 161 days.

(21) Appl. No.: 11/107,557

(22) Filed: Apr. 15, 2005

(65) Prior Publication Data

US 2006/0232357 A1 Oct. 19, 2006

(51) Int. Cl.
*H03H 11/24* (2006.01)

(52) U.S. Cl. .................. 333/81 A; 333/28 R; 338/216

(58) Field of Classification Search ............. 333/81 A, 333/81 R, 28 R, 172; 338/22 R, 216
See application file for complete search history.

(56) References Cited

U.S. PATENT DOCUMENTS 5,332,981 A * 7/1994 Mazzochette et al. .... 333/81 R
7,119,632 B2 * 10/2006 Blacka et al. ............ 333/81 A
2006/0028289 A1 * 2/2006 Blacka .................... 333/81 A

* cited by examiner

*Primary Examiner*—Stephen E. Jones
(74) *Attorney, Agent, or Firm*—Morgan, Lewis & Bockius LLP

(57) ABSTRACT

A temperature and frequency variable gain attenuator comprises a temperature variable attenuator and a temperature variable filter network whose resistances changed to c generate different responses that vary over temperature and frequency. At least three different thick film thermistors are used, with two of these used on the attenuator and a third one used on the filter network. The temperature coefficients of the thermistors are different and are selected so that the attenuator and filter network attenuation change at a controlled rate with changes in temperature while the impedance of the gain equalizer remains within acceptable levels. Substantially any temperature coefficient of resistance can be created for each resistor by properly selecting and mixing different inks when forming the thick film thermistors. Furthermore, the attenuator can have either a negative temperature coefficient of attenuation or a positive temperature coefficient of attenuation.

3 Claims, 7 Drawing Sheets

TEMPERATURE AND FREQUENCY VARIABLE GAIN ATTENUATOR

CROSS-REFERENCE TO RELATED APPLICATIONS

Related applications are application Ser. No. 11/107,556 for "Wideband Temperature Variable Attenuator," and application Ser. No. 11/107,558 for "Temperature Frequency Equalizer," both of which are filed simultaneously herewith, the disclosure of which are incorporated herein by reference.

FIELD OF THE INVENTION

The present invention is directed toward a temperature and frequency variable gain attenuator and more particularly toward an absorptive-type temperature and frequency variable microwave attenuator wherein the attenuation thereof changes at a controlled rate with changes in temperature and frequency while the impedance remains within acceptable levels.

BACKGROUND OF THE INVENTION

Gain equalizers are used in applications that require signal level control. Level control can be accomplished by either reflecting a portion of the input signal back to its source or by absorbing some of the signal in the equalizer itself. The latter case is often preferred because the mismatch which results from using a reflective equalizer can create problems for other devices in the system such as nonsymmetrical two-port amplifiers. It is for this reason that absorptive passive components are more popular, particularly in microwave applications.

Variations in temperature can affect various component parts of a microwave system causing differences in signal strengths at different temperatures and frequencies. Much time, effort and expense has gone into the design of components of such systems in an effort to stabilize them over various temperature and frequency ranges. This has greatly increased the cost of microwave systems that must be exposed to wide temperature ranges. A gain equalizer is a passive component which solves this issue by flattening the linear increase in attenuation or (decrease in gain) with frequency and temperature. In order to achieve this, the gain equalizer utilizes thermistors with resistances values that change over temperature.

One example of a gain equalizer is an absorptive-type temperature variable attenuator is the attenuator described in U.S. Pat. No. 5,332,981 entitled, "Temperature Variable Attenuator," which is incorporated herein by reference. Examples of the attenuator of the '981 patent include a Tee attenuator and a Pi attenuator. In each case at least one resistor has a temperature coefficient of resistance (TCR) that is different from that of the others such that the attenuation of the attenuator changes a controlled rate with changes in temperature while the impedance of the attenuator remains within acceptable levels.

SUMMARY OF THE INVENTION

Rather than attempt to stabilize the signal level of a microwave circuit by optimizing each component part thereof, the present invention contemplates that the signal level will vary over temperature and frequency, and controls the same utilizing an absorptive-type temperature variable attenuator. The absorptive-type temperature variable microwave attenuator of the present invention comprises an attenuator and a filter network. It is made utilizing at least three different thick film thermistors. The temperature coefficients of the thermistors are different and are selected so that the attenuator and filter network attenuation change at a controlled rate which changes with temperature and frequency while the impedance of the equalizer remains within acceptable levels. Substantially any temperature coefficient of resistance can be created for each thermistor by properly selecting and mixing different inks when forming the thick film resistors. Furthermore, gain equalizers can be created having either a negative temperature coefficient of attenuation or a positive temperature coefficient of attenuation.

BRIEF DESCRIPTION OF DRAWING

These and other objects, features and advantages of the invention well be more readily apparent from the following detailed description in which.

DETAILED DESCRIPTION

Figure 1:
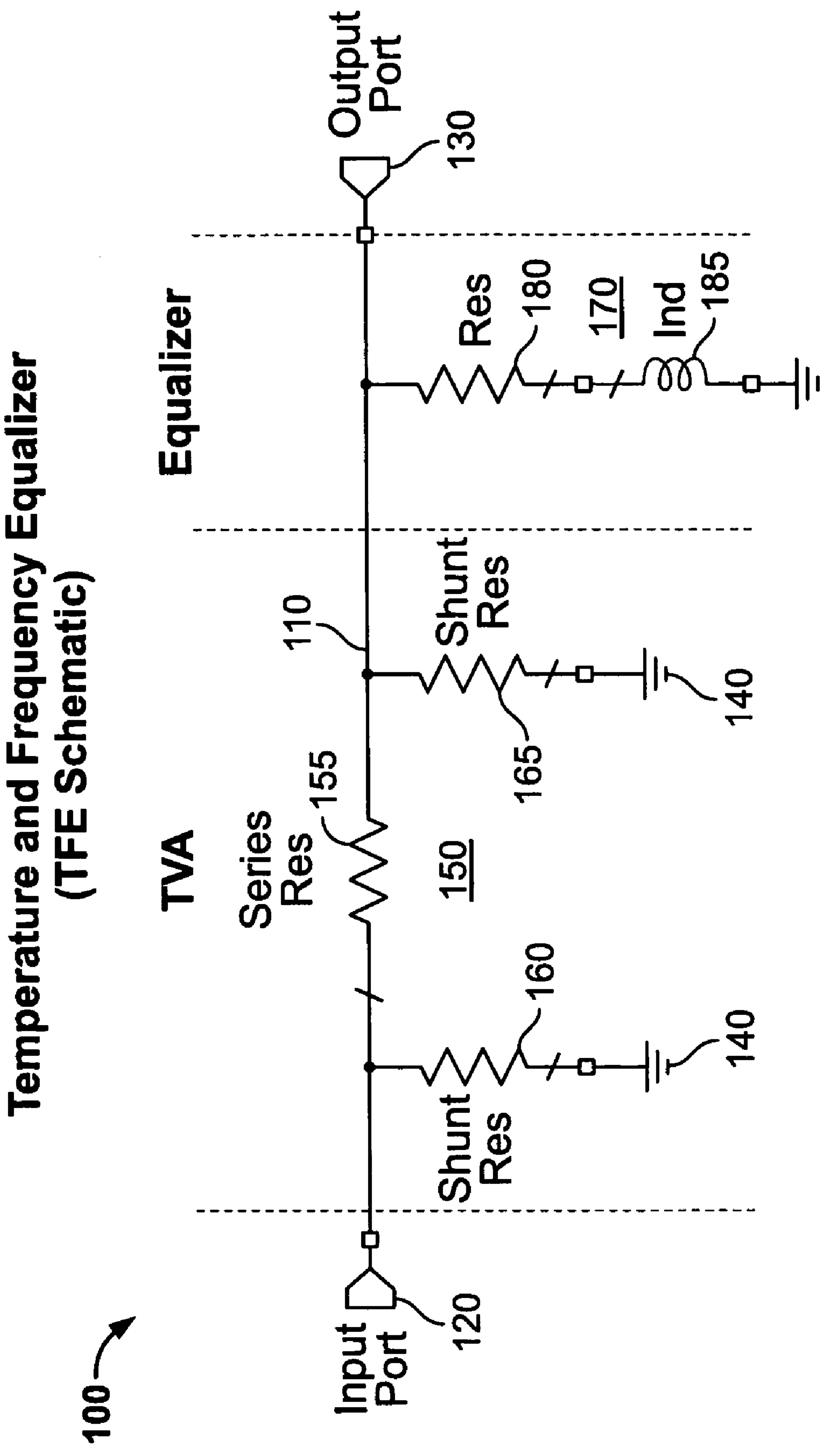
FIG. 1 is a schematic circuit diagram of a preferred embodiment of the invention.

FIG. 1 is a schematic circuit diagram of a temperature and frequency equalizer (TFE) 100 of the present invention. TFE 100 comprises a transmission line 110 extending between an input port 120 and an output port 130, a ground 140, an attenuator 150 and an equalizer 170. Attenuator 150 comprises a series resistor 155 and two shunt resistors 160, 165 connected in a Pi-configuration with one end of resistors 160, 165 being connected to ground. Equalizer 170 comprises a resistor 180 and an inductor 185 connected together in series with one end of the resistor being connected to the transmission line and one end of the inductor being connected to ground.

At least resistor 180 and two of the resistors of attenuator 150 are thermistors. The temperature coefficients of the thermistors are different and are selected so that the attenuation of TFE 100 changes at a controlled rate with temperature while the impedance of the TFE remains within acceptable levels over the operating temperature and frequency ranges of interest. As will be appreciated, the impedance that is observed over the operating frequency range and/or temperature range of the attenuator will not be precisely constant and the variation in impedance will depend on the amount of attenuation provided by the attenuator. At low attenuation, deviation from the desired impedance may be within +/−a few percent of the desired impedance over the operating range. At higher attenuations, deviation from the desired impedance can be expected to be higher, for example, +/−10%, +/−20% and even +/−50% or more in some cases. In practice, considerable variation in impedance may be tolerated depending on the specific application in which the attenuator is used and the temperature and frequency range of use. As a result of thumb, the variation in impedance of the attenuator should be such that the Voltage Standing Wave Ratio (VSWR) of the RF power is no more than 2.0:1 over the operating range of the attenuator.

Figure 2:
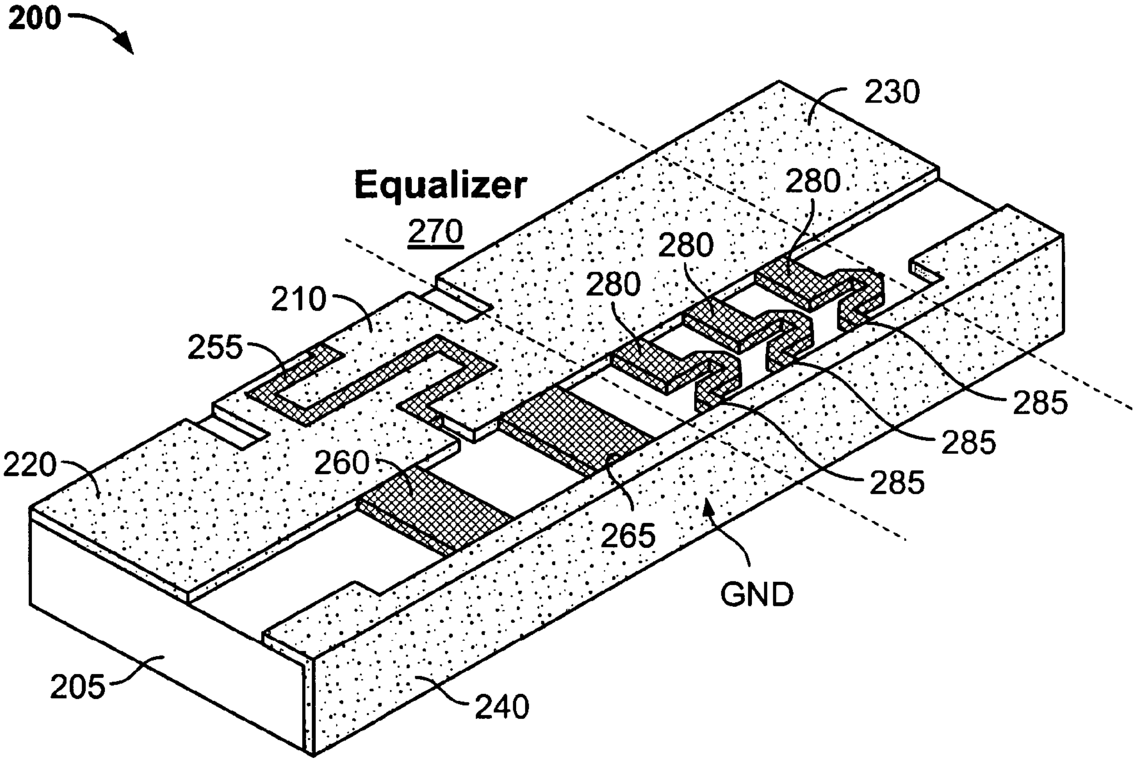
FIG. 2 is a top-view of a physical implementation of the embodiment of FIG. 1.

FIG. 2 is a top view of a TFE 200 that is a preferred implementation of TFE 100 of FIG. 1. TFE 200 comprises a transmission line 210 having input and output port 220, 230, a ground 240, an attenuator 250 and an equalizer 270. Attenuator 250 comprises a thick-film series resistor 255 and thick-film shunt resistors 260, 265 connected in a Pi-configuration with one end of each of resistors 260, 265 connected to ground 240. Equalizer 270 comprises thick-film resistor 280 and a thick-film quarter-wavelength transmission line 285 connected in series with one end of resistor 280 being connected to the transmission line and one end of transmission line being connected to ground.

The elements of TFE 200 are preferably formed by printing them on a surface of a substrate 205 and firing them at an appropriate temperature typically in the range of 600° C. to 900° C. In a preferred embodiment, TFE 200 measures 0.095 inches by 0.125 inches and is approximately 0.015 inches thick.

In one embodiment, thick-film resistors 255,260, 265, 280 and transmission line 285 are made from inks formed by combining a metal powder, such as, bismuth ruthenate, with glass frit and a solvent vehicle. This solution is printed on the substrate and then fired. When the resistor is fired, the glass frit melts and the metal particles in the powder adhere to the substrate, and to each other. This type of a resistor system can provide inks having various ranges of material resistivities and temperature characteristics that can be blended together to produce many different combinations.

The resistive characteristics of a thick film ink are specified in ohms-per-square (Ω/□). A particular resistor value can be achieved by either changing the geometry of the resistor or by blending inks with different resistivity. The resistance can be fine-tuned by varying the fired thickness of the resistor. This can be accomplished by changing the deposition thickness and/or the firing profile. Similar techniques can be used to change the temperature characteristics of the ink.

The temperature coefficient of the resistive ink defines how the resistive properties of the ink change with temperature. The Temperature Coefficient of Resistance (TCR) is often expressed in parts per million per degree Centigrade (PPM/C). The TCR can be used to calculate directly the amount of shift that can be expected from a resistor over a given temperature range. Once the desired TCR for a particular application is determined, it can be achieved by blending appropriate amounts of different inks. As with blending for sheet resistance, a TCR can be formed by blending two inks with TCR's above and below the desired TCR. One additional feature of TCR blending is that positive and negative TCR inks can be combined to produce large changes in the TCR of the resulting material.

Some thermistors exhibit a resistance hysteresis as a function of temperature. If the temperature of the resistor is taken beyond the crossover point at either end of the hysteresis loop, the resistor will retain a memory of this condition. As the temperature is reversed, the resistance will not change in the same manner observed prior to reaching the crossover point. In one embodiment, to avoid this problem, the inks used in producing a temperature variable attenuator are selected with crossover points that are beyond the typical operating range of −55 deg. C. to 125 deg. C.

Figure 3:
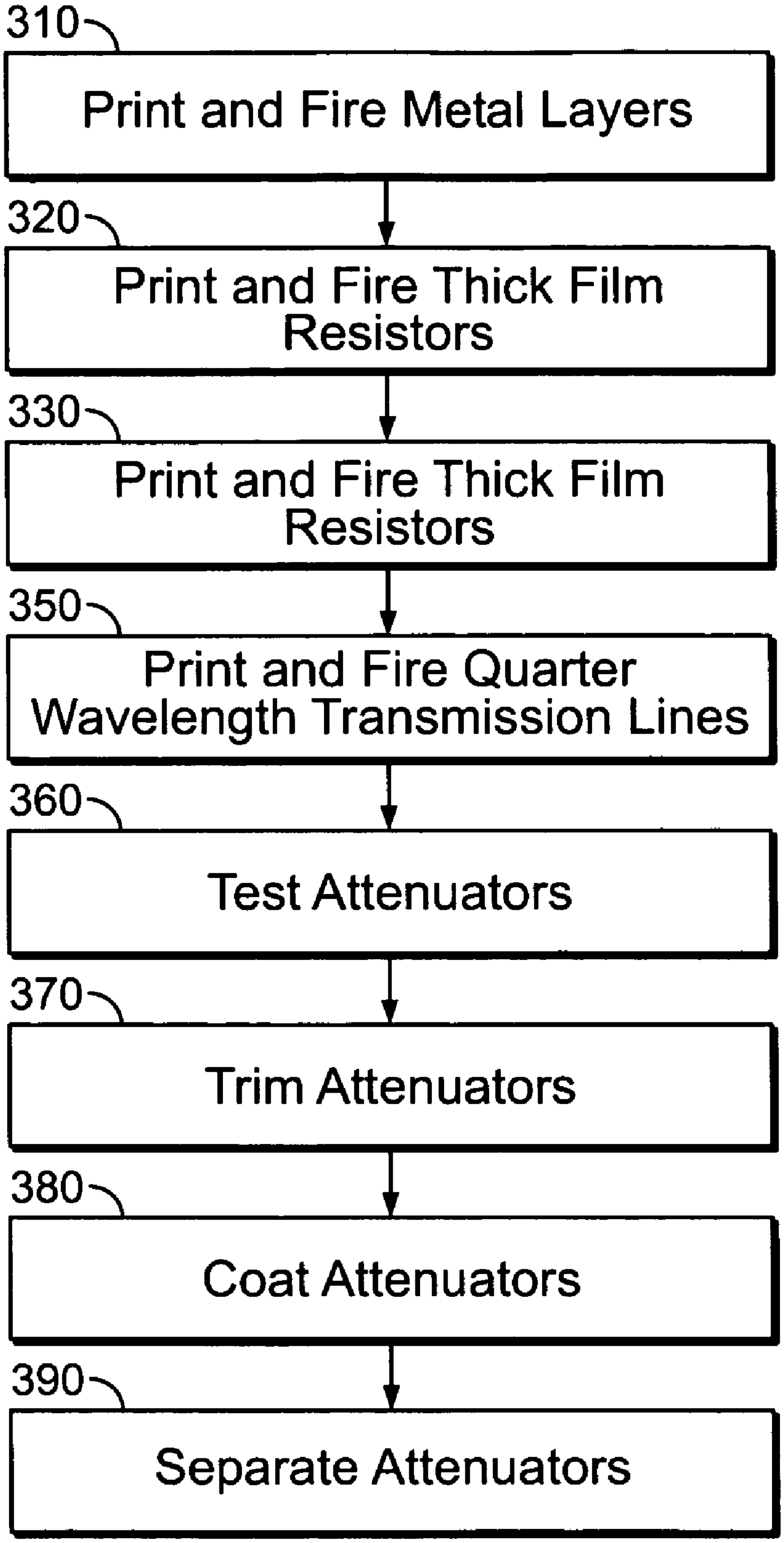
FIG. 3 is a flow chart depicting steps for the formation of the implementation of FIG. 2.

Advantageously, numerous temperature and frequency equalizers are made simultaneously by printing the transmission lines, ground, resistors and stubs on an insulating substrate in a process depicted in FIG. 3.

Illustratively, the substrate measures 4.5 inches by 4.5 inches and is approximately 0.015 inches thick. To maximize the number of equalizers that are formed at the same time, the equalizers are aligned on the substrate in a rectangular array. At step 310, metal layers are printed on the substrate to form the transmission line and ground. At steps 320, 330, . . . the thick film resistors are printed with each resistor having a different ink composition being printed separately. At step 350 the quarter wavelength transmission lines are printed. The individual attenuators are then tested at step 360 to determine the resistance and inductance of the resistors and stubs; and these elements are then laser-trimmed at step 370 to meet specifications. The attenuators are then coated with a protective coat at step 380 and labeled with the manufacturer's identification and part number; the substrate is scribed; and the individual attenuators are detached from the substrate at step 390.

Figure 4:
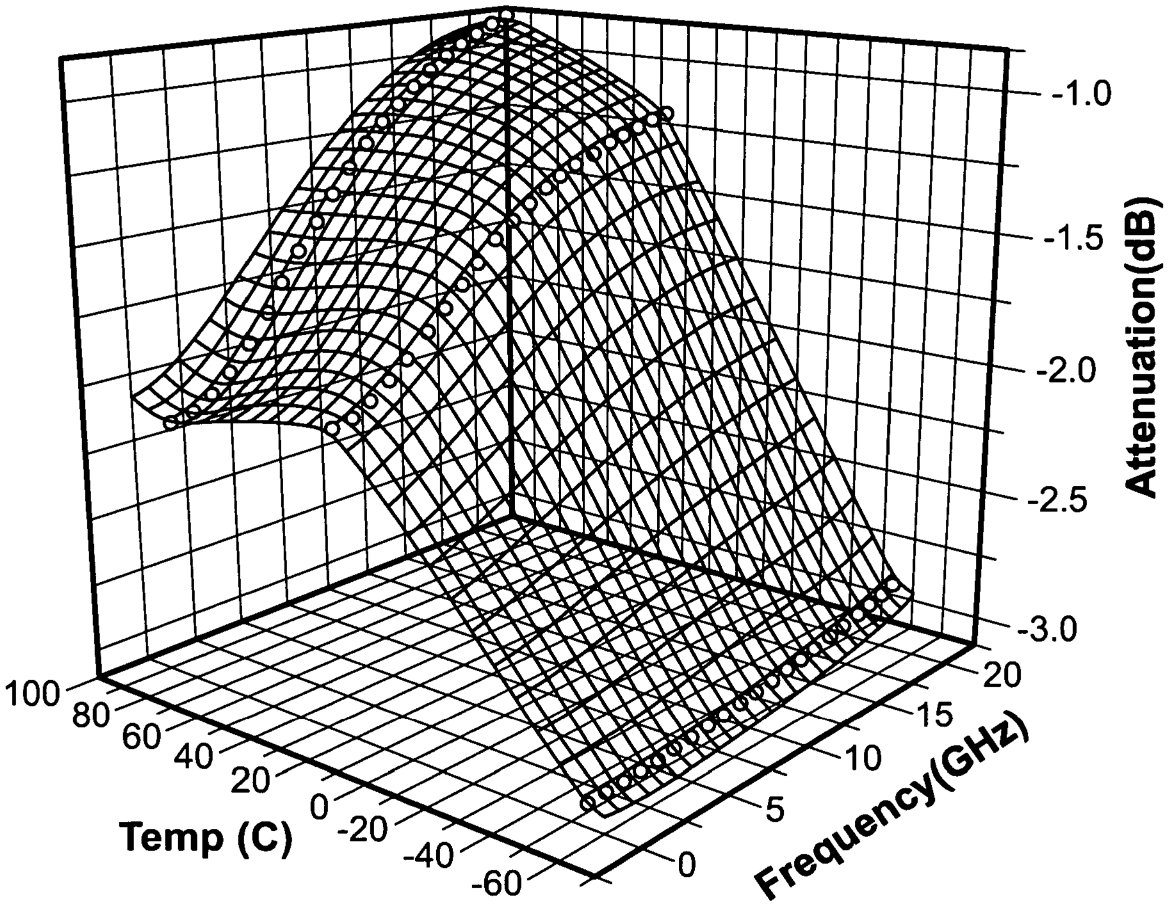
FIG. 4 is a plot of the attenuation of the circuit of FIG. 1 versus temperature and frequency.

FIG. 4 is a graph of attenuation versus temperature and frequency for TFE 100. As can be seen, the attenuation ranges between a little less than 1 deciBel and 3 deciBels over a temperature range of −50° C. to 100° C. and a frequency range of 50 MHz to 20 GHz.

Figure 5:
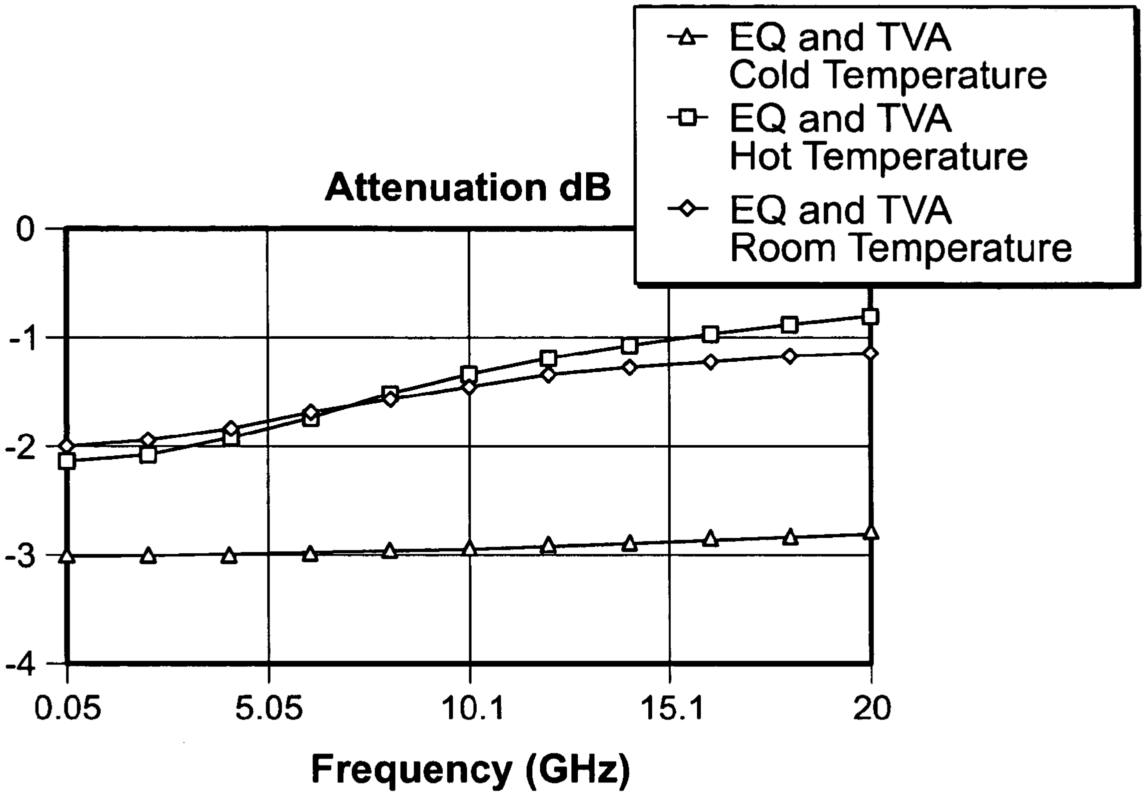
FIG. 5 is a plot of the attenuation of the circuit of FIG. 1 versus frequency at three different temperatures.

FIG. 5 graphs the same information as presented in FIG. 4 for three temperatures: −50° C., 25° C. and 85° C. As can be seen, at the lowest temperature, the attenuation is substantially constant over the entire frequency range of 50 MHz to 20 GHz. At room temperature of 25° C. and at higher temperature the attenuation decreases with temperature from about two deciBels at 50 MHz to about 1 deciBel at 20 GHz. As shown in FIG. 4 a similar decrease in attenuation is observed over the entire temperature range from 25° C. to 100° C.

Figure 6A:
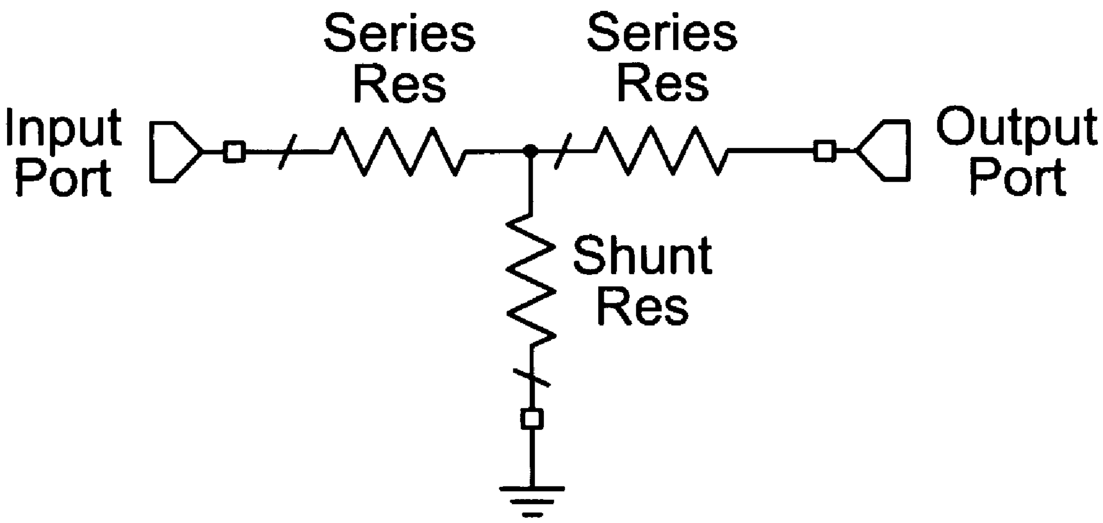
FIGS. 6A–6E are schematic diagrams illustrating alternative attenuators and filter networks that may be used in the practice of the invention.
Figure 6B:
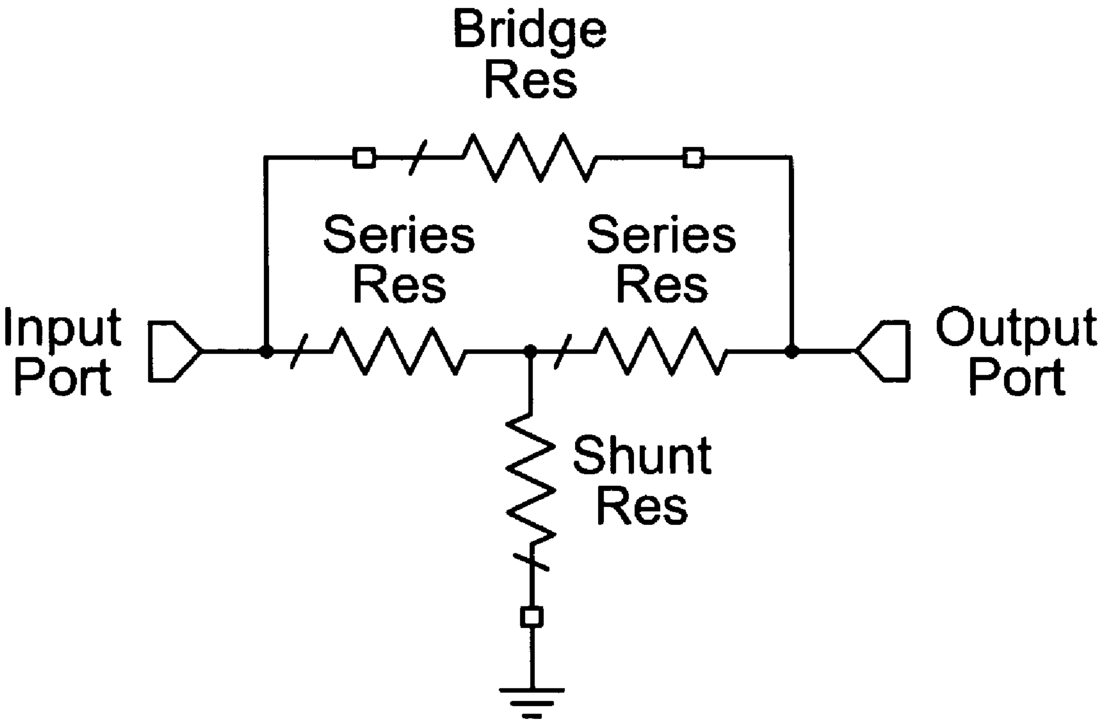

Numerous attenuator configurations may be used in the practice of invention. For example, a Tee-configuration attenuator 610 having a pair of series connected resistors 612, 614 and a single shunt resistor 616 as shown in FIG. 6A or a bridged Tee-configuration having an additional resistor 618 in parallel with the pair of series connected resistors 612, 614 as shown in FIG. 6B may be used in place of the Pi-configuration attenuator depicted in TFE 100 of FIG. 1. The Tee configuration attenuator may also have multiple shunt resistors as shown for example in above-referenced co-pending application Ser. No. 11/107,556 for "Wideband Temperature Variable Attenuator."

Figure 6C:
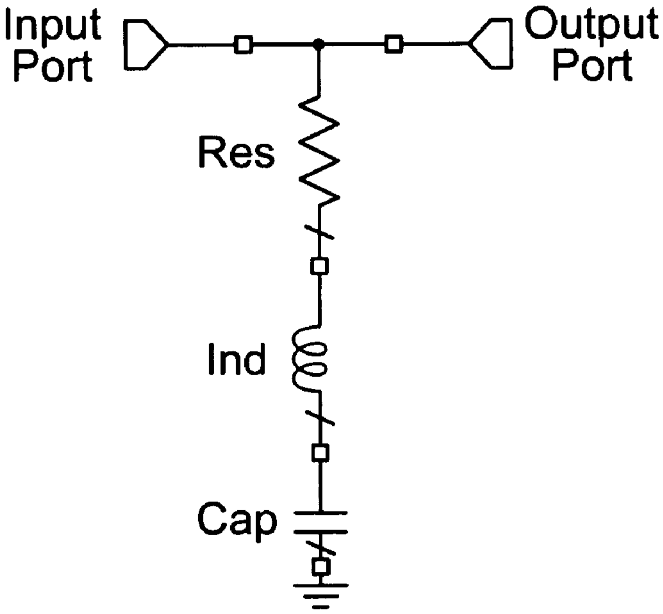
Figure 6D:
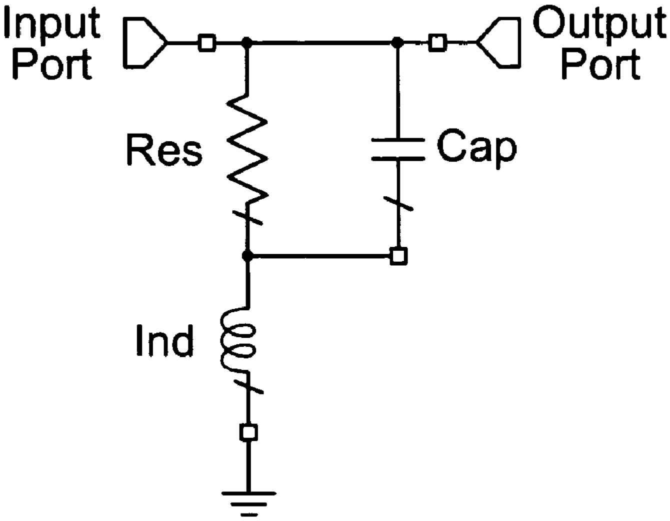
Figure 6E:
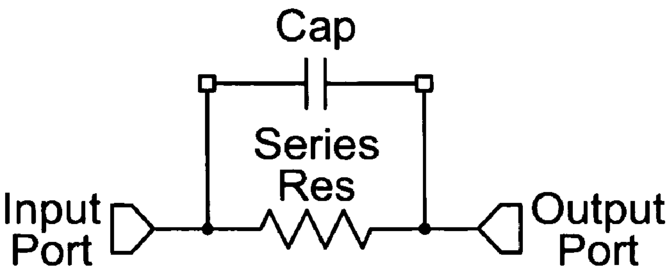

Likewise, a variety of equalizer configurations may be used in the practice of the invention. For example, a capacitor 640 may be added to the equalizer, either in series with a resistor 630 and inductor 635 as shown in FIG. 6C or in parallel with the resistor as shown in FIG. 6D. Different numbers of sets of resistors and inductors may be used instead of the three sets shown in FIGS. 1 and 2. And the shunt circuit may be replaced by a series resistance 670 and capacitor 675 in parallel therewith as shown in FIG. 6E.

Numerous variations may also be use din the implementation of the invention. Thin-film resistors may be used in place of thick-film resistors. Preferably, the substrate is made of alumina but other types of insulating substrates may be used such as beryllium oxide (BeO), aluminum nitride (Aln), CVD diamond and a glass-epoxy. The invention may also be implemented using low temperature co-fired ceramic substrates.

What is claimed is:

1. A temperature and frequency attenuator comprising:

a transmission line, a ground, an attenuator connected to the transmission line and ground, the attenuator comprising at least three resistors; and an equalizing element connected to the transmission line and ground, the equalizing element comprising at least one resistor and one element that is not a resistor, wherein at least one resistor in the equalizer and at least two resistors in the attenuator have a resistance that varies with temperature such that attenuation of the temperature and frequency equalizer changes at a controlled rate with changes in temperature.

2. The attenuator of claim 1 wherein the resistors are thick-film resistors.

3. The attenuator of claim 1 wherein the resistors are thin-film resistors.

* * * * *